(12) United States Patent
Tsai et al.

(10) Patent No.: US 11,353,759 B2
(45) Date of Patent: Jun. 7, 2022

(54) BACKPLANES WITH HEXAGONAL AND TRIANGULAR ELECTRODES

(71) Applicant: Nuclera Nucleics Ltd., Cambridge, MA (US)

(72) Inventors: Annie Tsai, Hsinshu (TW); Ian French, Hsinchu (TW); Cristina Visani, Cambridge, MA (US); David Zhitomirsky, Woburn, MA (US); Richard J. Paolini, Jr., Framingham, MA (US)

(73) Assignee: Nuclera Nucleics Ltd., Cambridge (GB)

( * ) Notice: Subject to any disclaimer, the term of this patent is extended or adjusted under 35 U.S.C. 154(b) by 0 days.

(21) Appl. No.: 16/572,022

(22) Filed: Sep. 16, 2019

(65) Prior Publication Data

US 2020/0089035 A1 Mar. 19, 2020

Related U.S. Application Data

(60) Provisional application No. 62/732,421, filed on Sep. 17, 2018.

(51) Int. Cl.
*G02F 1/1368* (2006.01)
*G02F 1/1362* (2006.01)
(Continued)

(52) U.S. Cl.
CPC ...... *G02F 1/136286* (2013.01); *G02F 1/1368* (2013.01); *G02F 1/167* (2013.01);
(Continued)

(58) Field of Classification Search
CPC ....................................................... G02F 1/1368
(Continued)

(56) References Cited

U.S. PATENT DOCUMENTS 4,573,995 A 3/1986 Chen et al.
4,708,716 A 11/1987 Sibalis
(Continued)

FOREIGN PATENT DOCUMENTS

CN 105665043 A 6/2016
JP H06186575 A 7/1994
(Continued)

OTHER PUBLICATIONS

Korean Intellectual Property Office, PCT/US2019/051379, International Search Report and Written Opinion, dated Jan. 3, 2020.
(Continued)

*Primary Examiner* — Long D Pham
(74) *Attorney, Agent, or Firm* — McCarter & English, LLP; David R. Burns; Coalton Sundiata Bennett

(57) ABSTRACT

Active matrix backplanes including an array of hexagonal electrodes or an array of triangular electrodes. Because the backplane designs route the gate lines along the periphery of the electrodes there is less cross talk with the surface of the electrode. The disclosed designs simplify construction and control of the electrodes and improve the regularity of the electric field above the electrode. Such backplane electrode designs may be particularly useful in electrowetting on dielectric (EWoD) devices and electrophoretic displays (EPD).

11 Claims, 10 Drawing Sheets

(51) Int. Cl.
*G02F 1/167* (2019.01)
*H01L 27/12* (2006.01)

(52) U.S. Cl.
CPC ........ *H01L 27/124* (2013.01); *H01L 27/1222* (2013.01); *H01L 27/1259* (2013.01); *G02F 2201/123* (2013.01)

(58) Field of Classification Search
USPC ....................................................... 345/107
See application file for complete search history.

(56) References Cited

U.S. PATENT DOCUMENTS

| | | |
|---|---|---|
| 5,080,646 A | 1/1992 | Theeuwes et al. |
| 5,311,337 A | 5/1994 | McCartney, Jr. |
| 5,535,028 A * | 7/1996 | Bae ...................... H01L 27/124 349/145 |
| 5,930,026 A | 7/1999 | Jacobson et al. |
| 6,046,790 A * | 4/2000 | Hara ................. G02F 1/136213 349/172 |
| 6,118,426 A | 9/2000 | Albert et al. |
| 6,124,851 A | 9/2000 | Jacobson |
| 6,130,773 A | 10/2000 | Jacobson et al. |
| 6,177,921 B1 | 1/2001 | Comiskey et al. |
| 6,232,950 B1 | 5/2001 | Albert et al. |
| 6,241,921 B1 | 6/2001 | Jacobson et al. |
| 6,252,564 B1 | 6/2001 | Albert et al. |
| 6,312,304 B1 | 11/2001 | Duthaler et al. |
| 6,312,971 B1 | 11/2001 | Amundson et al. |
| 6,376,828 B1 | 4/2002 | Comiskey |
| 6,392,786 B1 | 5/2002 | Albert |
| 6,413,790 B1 | 7/2002 | Duthaler et al. |
| 6,422,687 B1 | 7/2002 | Jacobson |
| 6,445,374 B2 | 9/2002 | Albert et al. |
| 6,445,489 B1 | 9/2002 | Jacobson et al. |
| 6,473,072 B1 | 10/2002 | Comiskey et al. |
| 6,480,182 B2 | 11/2002 | Turner et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson |
| 6,518,949 B2 | 2/2003 | Drzaic |
| 6,521,489 B2 | 2/2003 | Duthaler et al. |
| 6,531,997 B1 | 3/2003 | Gates et al. |
| 6,535,197 B1 | 3/2003 | Comiskey et al. |
| 6,545,291 B1 | 4/2003 | Amundson et al. |
| 6,611,107 B2 | 8/2003 | Mikami et al. |
| 6,639,578 B1 | 10/2003 | Comiskey et al. |
| 6,657,772 B2 | 12/2003 | Loxley |
| 6,664,944 B1 | 12/2003 | Albert et al. |
| D485,294 S | 1/2004 | Albert |
| 6,680,725 B1 | 1/2004 | Jacobson |
| 6,683,333 B2 | 1/2004 | Kazlas et al. |
| 6,704,133 B2 | 3/2004 | Gates et al. |
| 6,710,540 B1 | 3/2004 | Albert et al. |
| 6,724,519 B1 | 4/2004 | Comiskey et al. |
| 6,738,050 B2 | 5/2004 | Comiskey et al. |
| 6,750,473 B2 | 6/2004 | Amundson et al. |
| 6,753,999 B2 | 6/2004 | Zehner et al. |
| 6,816,147 B2 | 11/2004 | Albert |
| 6,819,471 B2 | 11/2004 | Amundson et al. |
| 6,825,068 B2 | 11/2004 | Denis et al. |
| 6,825,829 B1 | 11/2004 | Albert et al. |
| 6,825,970 B2 | 11/2004 | Goenaga et al. |
| 6,831,769 B2 | 12/2004 | Holman et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,865,010 B2 | 3/2005 | Duthaler et al. |
| 6,873,452 B2 | 3/2005 | Tseng et al. |
| 6,900,851 B2 | 5/2005 | Morrison et al. |
| 6,909,532 B2 | 6/2005 | Chung et al. |
| 6,922,276 B2 | 7/2005 | Zhang et al. |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 6,995,550 B2 | 2/2006 | Jacobson et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,023,420 B2 | 4/2006 | Comiskey et al. |
| 7,030,412 B1 | 4/2006 | Drzaic et al. |
| 7,030,854 B2 | 4/2006 | Baucom et al. |
| 7,034,783 B2 | 4/2006 | Gates et al. |
| 7,061,166 B2 | 6/2006 | Kuniyasu |
| 7,061,662 B2 | 6/2006 | Chung et al. |
| 7,075,502 B1 | 7/2006 | Drzaic et al. |
| 7,075,703 B2 | 7/2006 | O'Neil et al. |
| 7,106,296 B1 | 9/2006 | Jacobson |
| 7,110,163 B2 | 9/2006 | Webber et al. |
| 7,116,318 B2 | 10/2006 | Amundson et al. |
| 7,116,466 B2 | 10/2006 | Whitesides et al. |
| 7,119,759 B2 | 10/2006 | Zehner et al. |
| 7,119,772 B2 | 10/2006 | Amundson et al. |
| 7,148,128 B2 | 12/2006 | Jacobson |
| 7,163,612 B2 | 1/2007 | Sterling et al. |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,177,066 B2 | 2/2007 | Chung et al. |
| 7,190,008 B2 | 3/2007 | Amundson et al. |
| 7,193,625 B2 | 3/2007 | Danner et al. |
| 7,202,847 B2 | 4/2007 | Gates |
| 7,206,119 B2 | 4/2007 | Honeyman et al. |
| 7,223,672 B2 | 5/2007 | Kazlas et al. |
| 7,230,751 B2 | 6/2007 | Whitesides et al. |
| 7,242,514 B2 | 7/2007 | Chung et al. |
| 7,256,766 B2 | 8/2007 | Albert et al. |
| 7,259,744 B2 | 8/2007 | Arango et al. |
| 7,280,094 B2 | 10/2007 | Albert |
| 7,301,693 B2 | 11/2007 | Chaug et al. |
| 7,304,780 B2 | 12/2007 | Liu et al. |
| 7,304,787 B2 | 12/2007 | Whitesides et al. |
| 7,312,784 B2 | 12/2007 | Baucom et al. |
| 7,312,794 B2 | 12/2007 | Zehner et al. |
| 7,327,346 B2 | 2/2008 | Chung et al. |
| 7,327,511 B2 | 2/2008 | Whitesides et al. |
| 7,347,957 B2 | 3/2008 | Wu et al. |
| 7,349,148 B2 | 3/2008 | Doshi et al. |
| 7,352,353 B2 | 4/2008 | Albert et al. |
| 7,365,394 B2 | 4/2008 | Denis et al. |
| 7,365,733 B2 | 4/2008 | Duthaler et al. |
| 7,382,363 B2 | 6/2008 | Albert et al. |
| 7,388,572 B2 | 6/2008 | Duthaler et al. |
| 7,401,758 B2 | 7/2008 | Liang et al. |
| 7,408,699 B2 | 8/2008 | Wang et al. |
| 7,411,719 B2 | 8/2008 | Paolini, Jr. et al. |
| 7,420,549 B2 | 9/2008 | Jacobson et al. |
| 7,442,587 B2 | 10/2008 | Amundson et al. |
| 7,453,445 B2 | 11/2008 | Amundson |
| 7,471,274 B2 | 12/2008 | Kim |
| 7,492,339 B2 | 2/2009 | Amundson |
| 7,492,497 B2 | 2/2009 | Paolini, Jr. et al. |
| 7,528,822 B2 | 5/2009 | Amundson et al. |
| 7,535,624 B2 | 5/2009 | Amundson et al. |
| 7,545,358 B2 | 6/2009 | Gates et al. |
| 7,551,346 B2 | 6/2009 | Fazel et al. |
| 7,554,712 B2 | 6/2009 | Patry et al. |
| 7,560,004 B2 | 7/2009 | Pereira et al. |
| 7,583,251 B2 | 9/2009 | Arango et al. |
| 7,583,427 B2 | 9/2009 | Danner et al. |
| 7,598,173 B2 | 10/2009 | Ritenour et al. |
| 7,602,374 B2 | 10/2009 | Zehner et al. |
| 7,605,799 B2 | 10/2009 | Amundson et al. |
| 7,612,760 B2 | 11/2009 | Kawai |
| 7,636,191 B2 | 12/2009 | Duthaler |
| 7,649,674 B2 | 1/2010 | Danner et al. |
| 7,667,886 B2 | 2/2010 | Danner et al. |
| 7,672,040 B2 | 3/2010 | Sohn et al. |
| 7,679,599 B2 | 3/2010 | Kawai |
| 7,679,813 B2 | 3/2010 | Liang et al. |
| 7,679,814 B2 | 3/2010 | Paolini, Jr. et al. |

(56) References Cited

U.S. PATENT DOCUMENTS

| | | |
|---|---|---|
| 7,683,606 B2 | 3/2010 | Kang et al. |
| 7,688,297 B2 | 3/2010 | Zehner et al. |
| 7,688,497 B2 | 3/2010 | Danner et al. |
| 7,705,824 B2 | 4/2010 | Baucom et al. |
| 7,729,039 B2 | 6/2010 | LeCain et al. |
| 7,733,311 B2 | 6/2010 | Amundson et al. |
| 7,733,335 B2 | 6/2010 | Zehner et al. |
| 7,785,988 B2 | 8/2010 | Amundson et al. |
| 7,787,169 B2 | 8/2010 | Abramson et al. |
| 7,830,592 B1 | 11/2010 | Sprague et al. |
| 7,839,564 B2 | 11/2010 | Whitesides et al. |
| 7,843,626 B2 | 11/2010 | Amundson et al. |
| 7,859,637 B2 | 12/2010 | Amundson et al. |
| 7,859,742 B1 | 12/2010 | Chiu et al. |
| 7,880,958 B2 | 2/2011 | Zang et al. |
| 7,893,435 B2 | 2/2011 | Kazlas et al. |
| 7,898,717 B2 | 3/2011 | Patry et al. |
| 7,905,977 B2 | 3/2011 | Qi et al. |
| 7,952,557 B2 | 5/2011 | Amundson et al. |
| 7,956,841 B2 | 6/2011 | Albert et al. |
| 7,957,053 B2 | 6/2011 | Honeyman et al. |
| 7,982,479 B2 | 7/2011 | Wang et al. |
| 7,986,450 B2 | 7/2011 | Cao et al. |
| 7,999,787 B2 | 8/2011 | Amundson et al. |
| 8,009,344 B2 | 8/2011 | Danner et al. |
| 8,009,348 B2 | 8/2011 | Zehner et al. |
| 8,027,081 B2 | 9/2011 | Danner et al. |
| 8,049,947 B2 | 11/2011 | Danner et al. |
| 8,064,962 B2 | 11/2011 | Wilcox et al. |
| 8,072,675 B2 | 12/2011 | Lin et al. |
| 8,077,141 B2 | 12/2011 | Duthaler et al. |
| 8,089,453 B2 | 1/2012 | Comiskey et al. |
| 8,120,836 B2 | 2/2012 | Lin et al. |
| 8,125,501 B2 | 2/2012 | Amundson et al. |
| 8,139,050 B2 | 3/2012 | Jacobson et al. |
| 8,149,228 B2 | 4/2012 | Lin et al. |
| 8,159,636 B2 | 4/2012 | Sun et al. |
| 8,159,644 B2 | 4/2012 | Takatori |
| 8,173,000 B1 | 5/2012 | Hadwen et al. |
| 8,174,490 B2 | 5/2012 | Whitesides et al. |
| 8,208,193 B2 | 6/2012 | Patry et al. |
| 8,237,892 B1 | 8/2012 | Sprague et al. |
| 8,238,021 B2 | 8/2012 | Sprague et al. |
| 8,243,013 B1 | 8/2012 | Sprague et al. |
| 8,274,472 B1 | 9/2012 | Wang et al. |
| 8,289,250 B2 | 10/2012 | Zehner et al. |
| 8,300,006 B2 | 10/2012 | Zhou et al. |
| 8,305,341 B2 | 11/2012 | Arango et al. |
| 8,314,784 B2 | 11/2012 | Ohkami et al. |
| 8,319,759 B2 | 11/2012 | Jacobson et al. |
| 8,362,488 B2 | 1/2013 | Chaug et al. |
| 8,373,211 B2 | 2/2013 | Amundson et al. |
| 8,373,649 B2 | 2/2013 | Low et al. |
| 8,384,658 B2 | 2/2013 | Albert et al. |
| 8,389,381 B2 | 3/2013 | Amundson et al. |
| 8,395,836 B2 | 3/2013 | Lin |
| 8,419,273 B2 | 4/2013 | Hadwen et al. |
| 8,437,069 B2 | 5/2013 | Lin |
| 8,441,414 B2 | 5/2013 | Lin |
| 8,456,414 B2 | 6/2013 | Lin et al. |
| 8,456,589 B1 | 6/2013 | Sprague et al. |
| 8,462,102 B2 | 6/2013 | Wong et al. |
| 8,498,042 B2 | 7/2013 | Danner et al. |
| 8,514,168 B2 | 8/2013 | Chung et al. |
| 8,525,966 B2 | 9/2013 | Takatori |
| 8,529,743 B2 | 9/2013 | Kim et al. |
| 8,537,105 B2 | 9/2013 | Chiu et al. |
| 8,547,111 B2 | 10/2013 | Hadwen et al. |
| 8,547,628 B2 | 10/2013 | Wu et al. |
| 8,553,012 B2 | 10/2013 | Baucom et al. |
| 8,558,783 B2 | 10/2013 | Wilcox et al. |
| 8,558,785 B2 | 10/2013 | Zehner et al. |
| 8,558,786 B2 | 10/2013 | Lin |
| 8,558,855 B2 | 10/2013 | Sprague et al. |
| 8,576,162 B2 | 11/2013 | Kang et al. |
| 8,576,164 B2 | 11/2013 | Sprague et al. |
| 8,576,259 B2 | 11/2013 | Lin et al. |
| 8,593,396 B2 | 11/2013 | Amundson et al. |
| 8,605,032 B2 | 12/2013 | Liu et al. |
| 8,610,988 B2 | 12/2013 | Zehner et al. |
| 8,643,595 B2 | 2/2014 | Chung et al. |
| 8,653,832 B2 | 2/2014 | Hadwen et al. |
| 8,654,571 B2 | 2/2014 | John et al. |
| 8,665,206 B2 | 3/2014 | Lin et al. |
| 8,681,191 B2 | 3/2014 | Yang et al. |
| 8,714,780 B2 | 5/2014 | Ho et al. |
| 8,728,266 B2 | 5/2014 | Danner et al. |
| 8,730,153 B2 | 5/2014 | Sprague et al. |
| 8,743,077 B1 | 6/2014 | Sprague |
| 8,754,859 B2 | 6/2014 | Gates et al. |
| 8,764,958 B2 | 7/2014 | Wang |
| 8,791,891 B2 | 7/2014 | Van Dijk et al. |
| 8,797,258 B2 | 8/2014 | Sprague |
| 8,797,633 B1 | 8/2014 | Sprague et al. |
| 8,797,636 B2 | 8/2014 | Yang et al. |
| 8,810,525 B2 | 8/2014 | Sprague |
| 8,810,882 B2 | 8/2014 | Heikenfeld et al. |
| 8,815,070 B2 | 8/2014 | Wang et al. |
| 8,828,336 B2 | 9/2014 | Hadwen et al. |
| 8,830,560 B2 | 9/2014 | Danner et al. |
| 8,853,645 B2 | 10/2014 | Okada et al. |
| 8,891,155 B2 | 11/2014 | Danner et al. |
| 8,928,562 B2 | 1/2015 | Gates et al. |
| 8,928,641 B2 | 1/2015 | Chiu et al. |
| 8,958,044 B2 | 2/2015 | Takatori |
| 8,969,886 B2 | 3/2015 | Amundson |
| 8,976,444 B2 | 3/2015 | Zhang et al. |
| 8,980,075 B2 | 3/2015 | Cheng et al. |
| 8,994,705 B2 | 3/2015 | Jacobson et al. |
| 9,013,394 B2 | 4/2015 | Lin |
| 9,019,197 B2 | 4/2015 | Lin |
| 9,019,198 B2 | 4/2015 | Lin et al. |
| 9,019,318 B2 | 4/2015 | Sprague et al. |
| 9,025,234 B2 | 5/2015 | Lin |
| 9,025,238 B2 | 5/2015 | Chan et al. |
| 9,030,374 B2 | 5/2015 | Sprague et al. |
| 9,082,352 B2 | 7/2015 | Cheng et al. |
| 9,140,952 B2 | 9/2015 | Sprague et al. |
| 9,147,364 B2 | 9/2015 | Wu et al. |
| 9,152,003 B2 | 10/2015 | Danner et al. |
| 9,152,004 B2 | 10/2015 | Paolini, Jr. et al. |
| 9,171,508 B2 | 10/2015 | Sprague et al. |
| 9,201,279 B2 | 12/2015 | Wu et al. |
| 9,216,414 B2 | 12/2015 | Chu |
| 9,218,773 B2 | 12/2015 | Sun et al. |
| 9,223,164 B2 | 12/2015 | Lai et al. |
| 9,224,338 B2 | 12/2015 | Chan et al. |
| 9,224,342 B2 | 12/2015 | Sprague et al. |
| 9,224,344 B2 | 12/2015 | Chung et al. |
| 9,230,492 B2 | 1/2016 | Harrington et al. |
| 9,245,484 B2 | 1/2016 | Yamazaki et al. |
| 9,251,736 B2 | 2/2016 | Lin et al. |
| 9,262,973 B2 | 2/2016 | Wu et al. |
| 9,269,311 B2 | 2/2016 | Amundson |
| 9,285,648 B2 | 3/2016 | Liu et al. |
| 9,299,294 B2 | 3/2016 | Lin et al. |
| 9,310,661 B2 | 4/2016 | Wu et al. |
| 9,336,731 B2 | 5/2016 | Long et al. |
| 9,373,289 B2 | 6/2016 | Sprague et al. |
| 9,390,066 B2 | 7/2016 | Smith et al. |
| 9,390,661 B2 | 7/2016 | Chiu et al. |
| 9,412,314 B2 | 8/2016 | Amundson et al. |
| 9,419,024 B2 | 8/2016 | Ritenour et al. |
| 9,454,057 B2 | 9/2016 | Wu et al. |
| 9,458,543 B2 | 10/2016 | Hadwen |
| 9,460,666 B2 | 10/2016 | Sprague et al. |
| 9,495,918 B2 | 11/2016 | Harrington et al. |
| 9,501,981 B2 | 11/2016 | Lin et al. |
| 9,513,743 B2 | 12/2016 | Sjodin et al. |
| 9,514,667 B2 | 12/2016 | Lin |
| 9,529,240 B2 | 12/2016 | Paolini, Jr. et al. |
| 9,542,895 B2 | 1/2017 | Gates et al. |
| 9,564,088 B2 | 2/2017 | Wilcox et al. |
| 9,582,041 B2 | 2/2017 | Cheng et al. |

(56) References Cited

U.S. PATENT DOCUMENTS

| | | | |
|---|---|---|---|
| 9,612,502 B2 | 4/2017 | Danner et al. |
| 9,620,048 B2 | 4/2017 | Sim et al. |
| 9,620,066 B2 | 4/2017 | Bishop |
| 9,620,067 B2 | 4/2017 | Harrington et al. |
| 9,632,373 B2 | 4/2017 | Huang et al. |
| 9,666,142 B2 | 5/2017 | Hung |
| 9,671,635 B2 | 6/2017 | Paolini, Jr. |
| 9,672,766 B2 | 6/2017 | Sjodin |
| 9,679,185 B2 | 6/2017 | Chin |
| 9,691,333 B2 | 6/2017 | Cheng et al. |
| 9,721,495 B2 | 8/2017 | Harrington et al. |
| 9,778,500 B2 | 10/2017 | Gates et al. |
| 9,792,861 B2 | 10/2017 | Chang et al. |
| 9,792,862 B2 | 10/2017 | Hung et al. |
| 9,805,668 B2 | 10/2017 | Agostinelli et al. |
| 9,815,056 B2 | 11/2017 | Wu et al. |
| 9,841,653 B2 | 12/2017 | Wu et al. |
| 9,847,356 B2 | 12/2017 | Peng et al. |
| 9,921,451 B2 | 3/2018 | Telfer et al. |
| 9,966,018 B2 | 5/2018 | Gates et al. |
| 10,018,828 B2 | 7/2018 | Massard |
| 10,027,329 B2 | 7/2018 | Wu |
| 10,037,735 B2 | 7/2018 | Amundson |
| 10,048,563 B2 | 8/2018 | Paolini, Jr. et al. |
| 10,048,564 B2 | 8/2018 | Paolini, Jr. et al. |
| 10,190,743 B2 | 1/2019 | Hertel et al. |
| 10,229,641 B2 | 3/2019 | Yang et al. |
| 10,319,313 B2 | 6/2019 | Harris et al. |
| 2002/0060321 A1 | 5/2002 | Kazlas et al. |
| 2002/0090980 A1 | 7/2002 | Wilcox et al. |
| 2003/0102858 A1 | 6/2003 | Jacobson et al. |
| 2004/0085619 A1 | 5/2004 | Wu et al. |
| 2004/0105036 A1 | 6/2004 | Danner et al. |
| 2004/0119681 A1 | 6/2004 | Albert et al. |
| 2004/0246562 A1 | 12/2004 | Chung et al. |
| 2005/0122306 A1 | 6/2005 | Wilcox et al. |
| 2005/0122563 A1 | 6/2005 | Honeyman et al. |
| 2005/0253777 A1 | 11/2005 | Zehner et al. |
| 2006/0255322 A1 | 11/2006 | Wu et al. |
| 2007/0052757 A1 | 3/2007 | Jacobson |
| 2007/0091418 A1 | 4/2007 | Danner et al. |
| 2007/0103427 A1 | 5/2007 | Zhou et al. |
| 2007/0176912 A1 | 8/2007 | Beames et al. |
| 2007/0285385 A1 | 12/2007 | Albert et al. |
| 2008/0024429 A1 | 1/2008 | Zehner |
| 2008/0024482 A1 | 1/2008 | Gates et al. |
| 2008/0136774 A1 | 6/2008 | Harris et al. |
| 2008/0154179 A1 | 6/2008 | Cantor et al. |
| 2008/0303780 A1 | 12/2008 | Sprague et al. |
| 2009/0122389 A1 | 5/2009 | Whitesides et al. |
| 2009/0174651 A1 | 7/2009 | Jacobson et al. |
| 2009/0315044 A1 | 12/2009 | Amundson et al. |
| 2009/0322721 A1 | 12/2009 | Zehner et al. |
| 2010/0128341 A1* | 5/2010 | Cheng | G02B 26/005 359/292 |
| 2010/0177396 A1 | 7/2010 | Lin |
| 2010/0194733 A1 | 8/2010 | Lin et al. |
| 2010/0194789 A1 | 8/2010 | Lin et al. |
| 2010/0220121 A1 | 9/2010 | Zehner et al. |
| 2010/0225611 A1 | 9/2010 | Lee et al. |
| 2010/0265561 A1 | 10/2010 | Gates et al. |
| 2011/0063314 A1 | 3/2011 | Chiu et al. |
| 2011/0140744 A1 | 6/2011 | Kazlas et al. |
| 2011/0175875 A1 | 7/2011 | Lin |
| 2011/0187683 A1 | 8/2011 | Wilcox et al. |
| 2011/0193840 A1 | 8/2011 | Amundson et al. |
| 2011/0193841 A1 | 8/2011 | Amundson et al. |
| 2011/0199671 A1 | 8/2011 | Amundson et al. |
| 2011/0204375 A1* | 8/2011 | Yagi | H01L 29/66742 257/72 |
| 2011/0221740 A1 | 9/2011 | Yang et al. |
| 2011/0292319 A1 | 12/2011 | Cole |
| 2012/0001957 A1 | 1/2012 | Liu et al. |
| 2012/0098740 A1 | 4/2012 | Chiu et al. |
| 2012/0273702 A1 | 11/2012 | Culbertson et al. |
| 2012/0293858 A1 | 11/2012 | Telfer et al. |
| 2013/0063333 A1 | 3/2013 | Arango et al. |
| 2013/0146459 A1 | 6/2013 | Bazant et al. |
| 2013/0161193 A1 | 6/2013 | Jacobs et al. |
| 2013/0194250 A1 | 8/2013 | Amundson et al. |
| 2013/0249782 A1 | 9/2013 | Wu et al. |
| 2014/0009817 A1 | 1/2014 | Wilcox et al. |
| 2014/0078024 A1 | 3/2014 | Paolini, Jr. et al. |
| 2014/0192000 A1 | 7/2014 | Hung et al. |
| 2014/0204012 A1 | 7/2014 | Wu et al. |
| 2014/0210701 A1 | 7/2014 | Wu et al. |
| 2014/0240210 A1 | 8/2014 | Wu |
| 2014/0253425 A1 | 9/2014 | Zalesky et al. |
| 2014/0293398 A1 | 10/2014 | Wang et al. |
| 2015/0097877 A1 | 4/2015 | Lin et al. |
| 2015/0261057 A1 | 9/2015 | Harris et al. |
| 2015/0262255 A1 | 9/2015 | Khajehnouri et al. |
| 2015/0262551 A1 | 9/2015 | Zehner et al. |
| 2015/0378235 A1 | 12/2015 | Lin et al. |
| 2016/0077375 A1 | 3/2016 | Lin |
| 2016/0103380 A1 | 4/2016 | Kayal et al. |
| 2016/0140910 A1 | 5/2016 | Amundson |
| 2016/0178763 A1* | 6/2016 | Okada | H01L 31/0272 250/370.09 |
| 2016/0178890 A1* | 6/2016 | Massard | G02B 26/005 345/214 |
| 2016/0180777 A1 | 6/2016 | Lin et al. |
| 2016/0312165 A1 | 10/2016 | Lowe, Jr. et al. |
| 2017/0236474 A1* | 8/2017 | Xu | G09G 3/3614 345/209 |
| 2018/0110975 A1 | 4/2018 | Ivanhoff et al. |
| 2018/0271799 A1 | 9/2018 | Liu et al. |

FOREIGN PATENT DOCUMENTS

| | | |
|---|---|---|
| JP | 2008145998 A | 6/2008 |
| JP | 2013076729 A | 4/2013 |
| JP | 2013076739 A | 4/2013 |
| KR | 20070041934 A | 4/2007 |
| TW | 200916823 A | 4/2009 |
| WO | 1999067678 A2 | 12/1999 |
| WO | 2000005704 A1 | 2/2000 |
| WO | 2000036560 A1 | 6/2000 |
| WO | 2000038000 A1 | 6/2000 |

OTHER PUBLICATIONS

Panchagnula, R. et al., "Transdermal delivery of naloxone: skin permeation, pharmacokinetic, irritancy and stability studies", International Journal of Pharmaceutics, 293(1-2), pp. 213-223, Apr. 11, 2005.

Nisar, A. et al., "MEMS-based micropumps in drug delivery and biomedical applications", Sensors and Actuators B Chemical, vol. 130, Issue 2, pp. 917-942, Mar. 28, 2008.

Fouillet, Y. et al., "EWOD Digital Microfluidics for Lab on a Chip", International Conference on Nanochannels, Microchannels, and Minichannels, Paper No. ICNMM2006-96020, pp. 1255-1264, (Sep. 2008).

Korean Intellectual Property Office, PCT/US2019/056173, International Search Report and Written Opinion, dated Jan. 31, 2020.

Abdelgawad, Mohamed et al., "The Digital Revolution: A New Paradigm for Microfluidics", Advanced Materials, vol. 21, pp. 920-925,(2009). Jan. 1, 2009.

Zhao, Ya-Pu et al., "Fundamentals and Applications of Electrowetting: A Critical Review", Rev. Adhesion Adhesives, vol. 1, No. 1, pp. 114-174 (2013) Feb. 1, 2013.

Kalsi, S. et al., "Rapid and sensitive detection of antibiotic resistance on a programmable digital microfluidic platform", Lab on a Chip, Issue No. 14 (2015) Jun. 18, 2015.

Choi, Kihwan et al., "Digital Microfluidics", Annu. Rev. Anal. Chem. 5:413-40 (2012). Apr. 9, 2012.

Dong, Tao et al., "Capacitance Variation Induced by Microfluidic Two-Phase Flow across Insulated Interdigital Electrodes in Lab-On-Chip Devices", Sensors, 15, pp. 2694-2708 (2015) Jan. 20, 2015.

(56) References Cited

OTHER PUBLICATIONS

Geronimo, G. De et al., "Front-end electronics for imaging detectors", Nuclear Instrumentsand Methods in Physics Research A, 471 pp. 192-199, (2001). Jan. 1, 2001.
Korean International Patent Office, PCT/US2018/056037, International Search Report and Written Opinion, dated Feb. 3, 2019.

* cited by examiner

BACKPLANES WITH HEXAGONAL AND TRIANGULAR ELECTRODES

RELATED APPLICATIONS

This application claims priority to U.S. Provisional Patent Application No. 62/732,421, filed Sep. 17, 2018. All references, patents, and patent applications disclosed herein are incorporated by reference in their entireties.

BACKGROUND OF INVENTION

The present invention relates to backplanes for electro-optic displays. More specifically, it is related to non-traditional pixel shapes, such as hexagonal or triangular. Many displays (LCD and electrophoretic) use arrays of electrodes to present pixels of various colorations that are perceived by a viewer as an image. Such pixel arrays traditionally use rectangular or square electrodes, sometimes with edge structures. In this case, each electrode has four nearest neighbor electrodes joined by an edge. Because of the array structure, the pixels can be quickly and individually addressed using scan and gate lines, along with coordinated controllers. Similar structures can be used for non-display purposes, such as particle sensing and electrowetting on dielectric (EWoD).

The term "electro-optic" as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range. While this application refers to devices as electro-optic devices, generally, it is to be understood that the same structure may be used for a non-optical, i.e., non-display application, such as particle sensing or electrowetting on dielectric (EWoD).

The term "gray state" is used herein in its conventional meaning in the imaging art to refer to a state intermediate two extreme optical states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in optical state may not be a color change at all. The terms "black" and "white" may be used hereinafter to refer to the two extreme optical states of a display, and should be understood as normally including extreme optical states which are not strictly black and white, for example the aforementioned white and dark blue states. The term "monochrome" may be used hereinafter to denote a drive scheme that only drives pixels to their two extreme optical states with no intervening gray states.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published US Patent Application No. 2002/0180687 (see also the corresponding International Application Publication No. WO 02/079869) that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

The term "impulse" is used herein in its conventional meaning of the integral of voltage with respect to time. However, some bistable electro-optic media act as charge transducers and with such media an alternative definition of impulse, namely the integral of current over time (which is equal to the total charge applied) may be used. The appropriate definition of impulse should be used, depending on whether the medium acts as a voltage-time impulse transducer or a charge impulse transducer.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Films and sub-assemblies containing electro-optic materials; see for example U.S. Pat. Nos. 6,982,178 and 7,839,564;

(d) Backplanes, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,327,511; 7,349,148; 7,352,353; 7,365,394; 7,365,733; 7,382,363; 7,388,572; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,843,626; 7,859,637; 7,893,435; 7,898,717; 7,957,053; 7,986,450; 8,009,344; 8,027,081; 8,049,947; 8,077,141; 8,089,453; 8,208,193; 8,373,211; 8,389,381; 8,498,042; 8,610,988; 8,728,266; 8,754,859; 8,830,560; 8,891,155; 8,969,886; 9,152,003; and 9,152,004; and U.S. Patent Applications Publication Nos. 2002/0060321; 2004/0105036; 2005/0122306;

2005/0122563; 2007/0052757; 2007/0097489; 2007/0109219; 2009/0122389; 2009/0315044; 2011/0026101; 2011/0140744; 2011/0187683; 2011/0187689; 2011/0292319; 2013/0278900; 2014/0078024; 2014/0139501; 2014/0300837; 2015/0171112; 2015/0205178; 2015/0226986; 2015/0227018; 2015/0228666; and 2015/0261057; and International Application Publication No. WO 00/38000; European Patents Nos. 1,099,207 B1 and 1,145,072 B1;

(e) Color formation and color adjustment; see for example U.S. Pat. Nos. 7,075,502 and 7,839,564;

(f) Methods for driving displays; see for example U.S. Pat. Nos. 5,930,026; 6,445,489; 6,504,524; 6,512,354; 6,531,997; 6,753,999; 6,825,970; 6,900,851; 6,995,550; 7,012,600; 7,023,420; 7,034,783; 7,116,466; 7,119,772; 7,193,625; 7,202,847; 7,259,744; 7,304,787; 7,312,794; 7,327,511; 7,453,445; 7,492,339; 7,528,822; 7,545,358; 7,583,251; 7,602,374; 7,612,760; 7,679,599; 7,688,297; 7,729,039; 7,733,311; 7,733,335; 7,787,169; 7,952,557; 7,956,841; 7,999,787; 8,077,141; 8,125,501; 8,139,050; 8,174,490; 8,289,250; 8,300,006; 8,305,341; 8,314,784; 8,373,649; 8,384,658; 8,558,783; 8,558,785; 8,593,396; and 8,928,562; and U.S. Patent Applications Publication Nos. 2003/0102858; 2005/0253777; 2007/0091418; 2007/0103427; 2008/0024429; 2008/0024482; 2008/0136774; 2008/0291129; 2009/0174651; 2009/0179923; 2009/0195568; 2009/0322721; 2010/0220121; 2010/0265561; 2011/0193840; 2011/0193841; 2011/0199671; 2011/0285754; 2013/0063333; 2013/0194250; 2013/0321278; 2014/0009817; 2014/0085350; 2014/0240373; 2014/0253425; 2014/0292830; 2014/0333685; 2015/0070744; 2015/0109283; 2015/0213765; 2015/0221257; and 2015/0262255;

(g) Applications of displays; see for example U.S. Pat. Nos. 6,118,426; 6,473,072; 6,704,133; 6,710,540; 6,738,050; 6,825,829; 7,030,854; 7,119,759; 7,312,784; and 8,009,348; 7,705,824; 8,064,962; and 8,553,012; and U.S. Patent Applications Publication Nos. 2002/0090980; 2004/0119681; and 2007/0285385; and International Application Publication No. WO 00/36560; and (h) Non-electrophoretic displays, as described in U.S. Pat. Nos. 6,241,921; 6,950,220; 7,420,549; 8,319,759; and 8,994,705 and U.S. Patent Application Publication No. 2012/0293858.

The present invention provides efficient designs for pixel arrays with non-traditional shapes that can employ traditional scan and gate lines, controllers, shift registers, etc.

SUMMARY OF INVENTION

The invention provides backplanes having an array of hexagonal electrodes or an array of triangular electrodes. Because the backplane designs route the gate lines along the periphery of the electrodes there is less cross talk with the surface of the electrode. These designs simplify construction and control of the electrodes and improve the regularity of the electric field above the electrode. Such electrode designs may be particularly useful in particle sensing and EWoD applications, however, there is no reason that the designs cannot be used in a more traditional display, such as an LCD display or an electrophoretic display (EPD).

A benefit of the backplane electrode structures disclosed is that they are easily coupled to standard controllers and can result in simple pinouts that are plug-and-play with existing ecosystems. This reduces the complexity of the substrates as well as interfaces with printed circuit boards, thereby reducing costs.

In one aspect, the invention provides a pixel electrode backplane including a plurality of scan lines, a plurality of gate lines, a plurality of storage capacitors, a plurality of thin film transistors, and a plurality of hexagonal electrodes. Typically, the storage capacitors are larger than 0.5 pF. In the invention, the hexagonal electrodes are arranged in a honeycomb structure, and the voltage potential of each hexagonal electrode is controllable with only one scan line and only one gate line. In some embodiments, the plurality of scan lines is coupled to a scan controller and the plurality of gate lines is coupled to a gate controller. In some embodiments, the gate lines are routed parallel to the edges of the hexagonal electrodes.

In another aspect, the invention provides a pixel electrode backplane including a plurality of scan lines, a plurality of gate lines, a plurality of storage capacitors, a plurality of thin film transistors, and a plurality of triangular electrodes. Typically, the storage capacitors are larger than 0.5 pF. In the invention, two triangular electrodes or four triangular electrodes are arranged as a square and the voltage potential of each triangular electrode is controllable with only one scan line and only one gate line. In some embodiments, the plurality of scan lines is coupled to a scan controller and the plurality of gate lines is coupled to a gate controller. In some embodiments, the gate lines are routed parallel to the edges of the triangular electrodes. In some embodiments, the scan lines are routed parallel to the edges of the triangular electrodes.

The functionality of the backplane electrodes can be expanded by disposing a dielectric layer over the pixel electrodes, as well as a hydrophobic layer over the dielectric layer. Such coated pixel electrode backplanes can be incorporated into microfluidic devices by adding a light-transmissive electrode and a spacer disposed between the pixel electrode backplane and the light-transmissive electrode.

In other embodiments, the backplane electrodes can be the basis for controlling an electrophoretic display (EPD) by adding a light-transmissive electrode and disposing an electrophoretic medium (typically charged particles in a nonpolar solvent) between the backplane electrodes and the light-transmissive electrode.

BRIEF DESCRIPTION OF DRAWINGS

In FIG. 9, a negative charge is induced in a liquid at the liquid/dielectric interface above a (lower) electrode receiving an AC signal, while a positive charge is induced when negative voltage is applied to an opposing (upper) electrode. (This figure shows instant that the leftmost electrode is positively charged during the AC cycle.) As shown in FIG. 9, a pixel always has opposite charge to the induced charge at the droplet interface.

DETAILED DESCRIPTION

Figure 1:
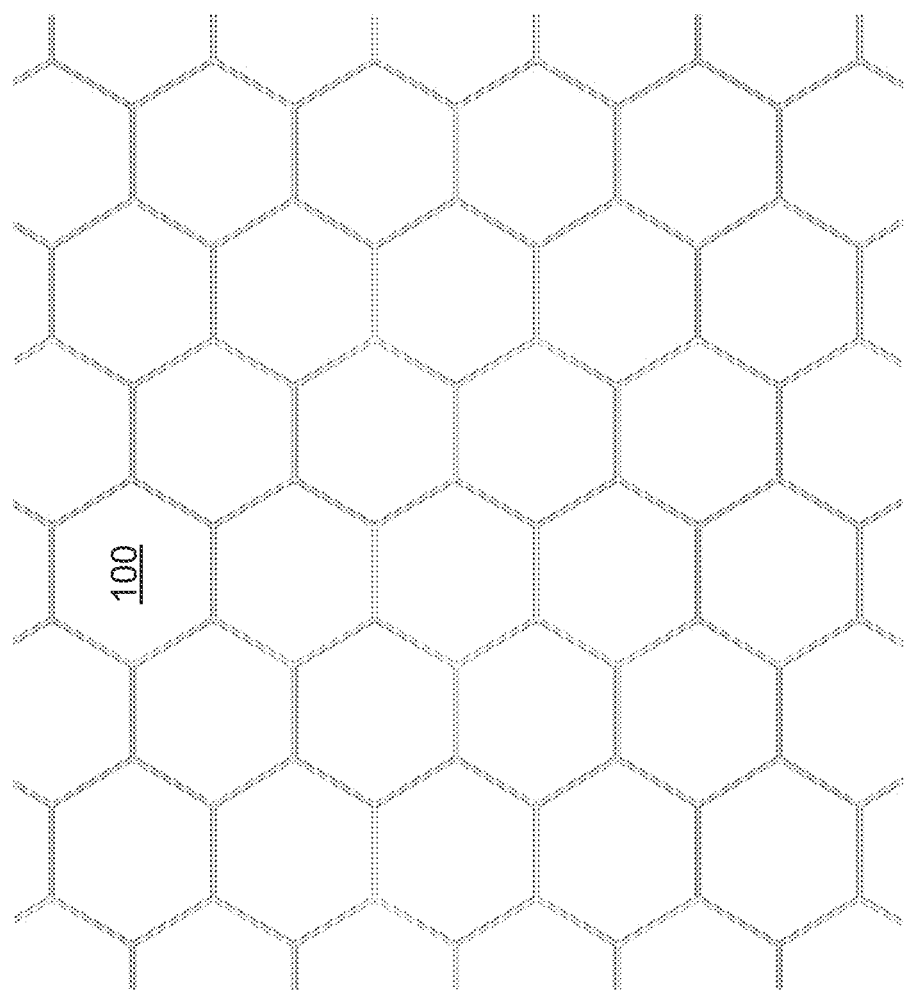
FIG. 1 shows a plurality of hexagonal electrodes arranged in a honeycomb. The invention provides for easy fabrication of such an array while providing simple individual control of each hexagonal pixel with a scan line and a gate line.

The invention provides for arrays of hexagonal and triangular electrodes that individually addressable with conventional scan/gate driving. Such arrays may be useful in creating displays, such as liquid crystal displays (LCD) or electrophoretic displays (EPD). Such arrays may also be useful in non-display applications, such as particle (e.g., photon) sensors or electrowetting on dielectric (EWoD), which may be used for microfluidic applications such as lab-on-a chip assays.

Creating digital pictures requires the ability to address individual spatial elements (pixels) quickly. In some instances, each pixel is its own color source (e.g., full color electrophoretic displays described in U.S. Pat. No. 9,921,451), in other instances, several sub-pixels act in concert to give the illusion of a range of colors for the pixel. While it is possible to wire each pixel to control the voltage state individually, it is more common to provide an array of non-linear elements, such as transistors or diodes, with at least one non-linear element associated with each pixel (or sub-pixel), to produce an "active matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high-resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again, the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode that is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner. (Throughout this document, the gate lines are horizontal and the scan lines are vertical.) Because driving electronics are typically arranged as a matrix, the pixel electrodes coupled to the driving electronics are commonly square or rectangular and arranged in a rectangular array in order to maximize the area covered by the electrodes.

Processes for manufacturing active matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Liquid crystal displays commonly employ amorphous silicon ("a-Si"), thin-film transistors ("TFTs") as switching devices for display pixels. Such TFTs typically have a bottom-gate configuration. Within one pixel, a thin film capacitor typically holds a charge transferred by the switching TFT. Electrophoretic displays can use similar TFTs with capacitors, although the function of the capacitors differs somewhat from those in liquid crystal displays; see the aforementioned copending application Ser. No. 09/565,413, and Publications 2002/0106847 and 2002/0060321. Thin film transistors can be fabricated to provide high performance. Fabrication processes, however, can result in significant cost.

In TFT addressing arrays, pixel electrodes are charged via the TFTs during a line address time. During the line address time, a TFT is switched to a conducting state by changing an applied gate voltage. For example, for an n-type TFT, a gate voltage is switched to a "high" state to switch the TFT into a conducting state.

It should be appreciated that the backplanes described herein may be extended to an electro-optic display comprising a layer of electro-optic medium disposed on the backplane and covering the pixel electrode. Such an electro-optic display may use any of the types of electro-optic medium previously discussed; for example, the electro-optic medium may be a liquid crystal, a rotating bichromal member or electrochromic medium, or an electrophoretic medium, preferably an encapsulated electrophoretic medium. In some embodiments, when an electrophoretic medium is utilized, a plurality of charged particles can move through a suspending fluid under the influence of an electric field. Such electrophoretic displays can have attributes of good brightness and contrast, wide viewing angles, state bistability, and low power consumption when compared with liquid crystal displays.

The backplanes described herein may also be used for electrowetting on dielectric (EWoD). An EWoD device typically includes a cell filled with an oil and at least one aqueous droplet. The cell gap is typically in the range 50 to 200 μm, but the gap can be larger. In a basic configuration, a plurality of propulsion electrodes (pixels) are disposed on one substrate and a singular top electrode is disposed on the opposing surface. The cell additionally includes hydrophobic coatings on the surfaces contacting the oil layer, as well as a dielectric layer between the propulsion electrodes and the hydrophobic coating. (The upper substrate may also include a dielectric layer). The hydrophobic layer prevents the droplet from wetting the surface. When no voltage differential is applied between adjacent electrodes, the droplet will maintain a spheroidal shape to minimize contact with the hydrophobic surfaces (oil and hydrophobic layer). Because the droplets do not wet the surface, they are less likely to contaminate the surface or interact with other droplets except when that behavior is desired. By individually addressing the electrodes in the active matrix, it is possible to move droplets of water, split the droplets, and merge droplets. Because the water droplets are compatible with biological molecules, it is possible to perform bioassays on minute quantities of samples. Conventional rectangular arrays can limit functionality in EWoD devices, because the only options are up/down/left/right whereas a hexagonal electrode of the invention has six nearest neighbor electrodes for more directions of movement and forces can be applied at 60°, 120° and linearly.

FIG. 1 illustrates a top view of an array of hexagonal electrodes 100. FIG. 1 is arranged as a traditional honeycomb; however, the other repeating structures are possible. Additionally, each hexagon electrode need not be regular in that each side and each angle are the same.

Figure 2:
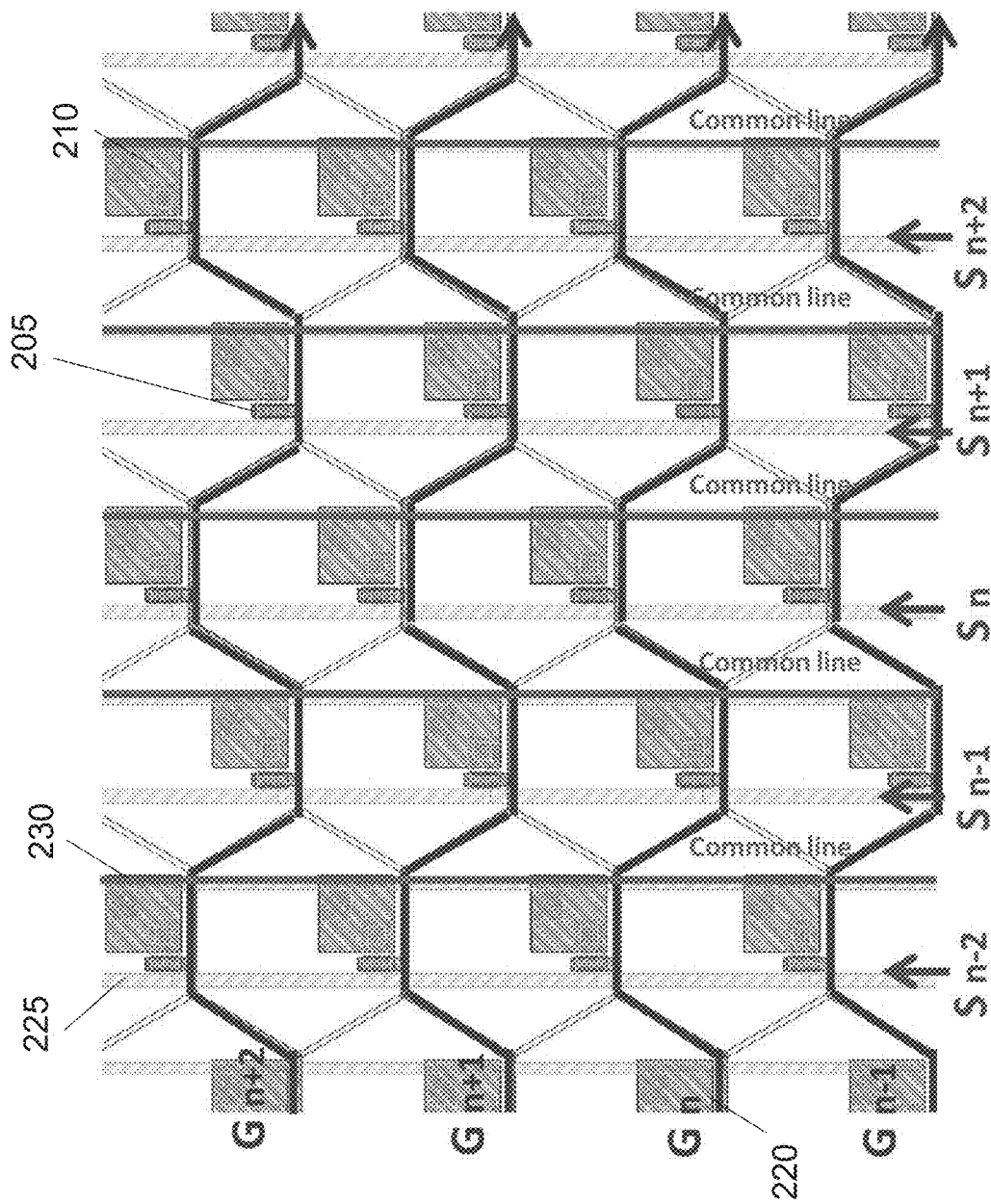
FIG. 2 illustrates the driving details the hexagonal array, including gate lines ($G_n$), scan lines ($S_n$), thin film transistors, and storage capacitors.
Figure 3:
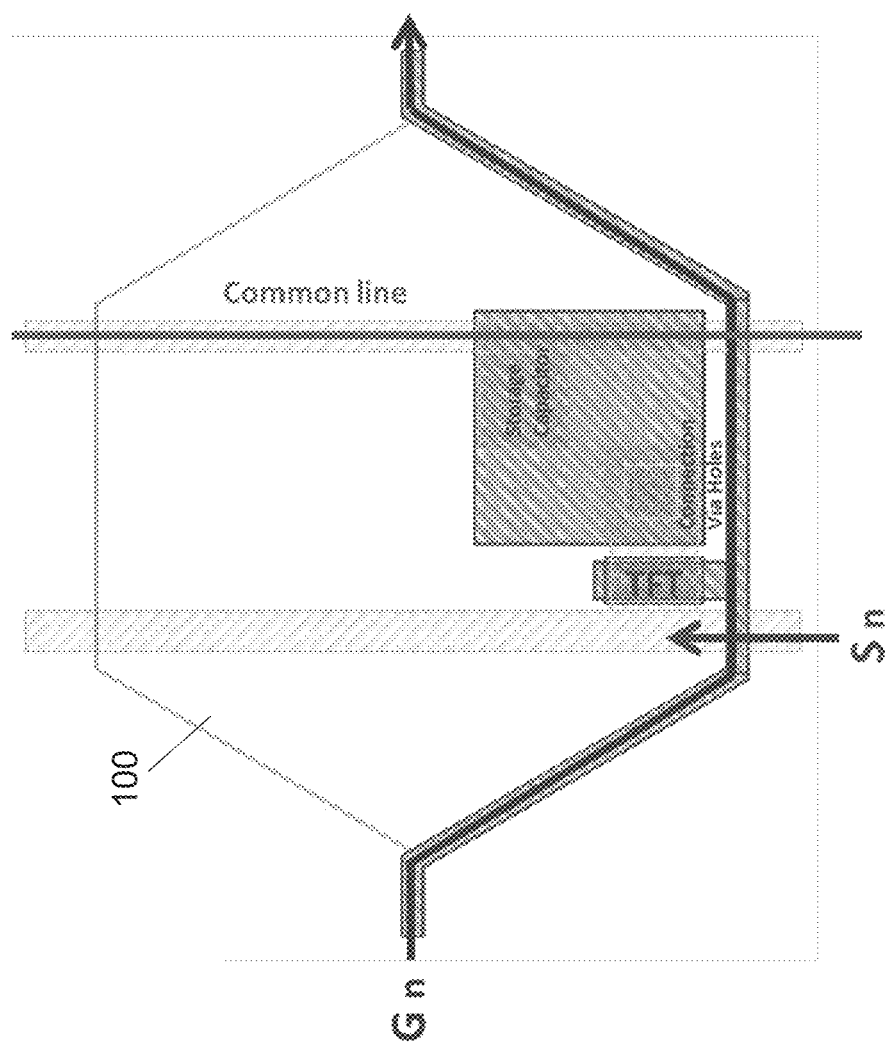
FIG. 3 illustrates an embodiment of the pixel electronics for a hexagonal electrode.

FIG. 2 is an overhead view of the driving electronics as arranged for a hexagonal array of the invention. As shown in FIG. 2, each hexagonal electrode includes a thin-film transistor (TFT) 205 and a storage capacitor 210. Gate lines 220 and scan lines 225, as discussed above control the TFT 205. Notably, in the arrangement of the invention, the gate lines travel parallel to the perimeter of the hexagonal electrodes. This allows each hexagonal electrode to be addressed by a gate line and a scan line, as would typically be arranged in a backplane, and controlled by a gate controller and a scan controller (see FIG. 4A). Because the gate lines are running along the perimeter of the electrodes (and not under), the electric field on the electrode is more consistent across the surface of the electrode. This feature is especially useful when the hexagonal electrodes are larger (i.e., on the order of 500 μm) and field inconsistencies can affect the performance of the device (i.e., stopping a droplet, or showing a wrong color).

Figure 4B:
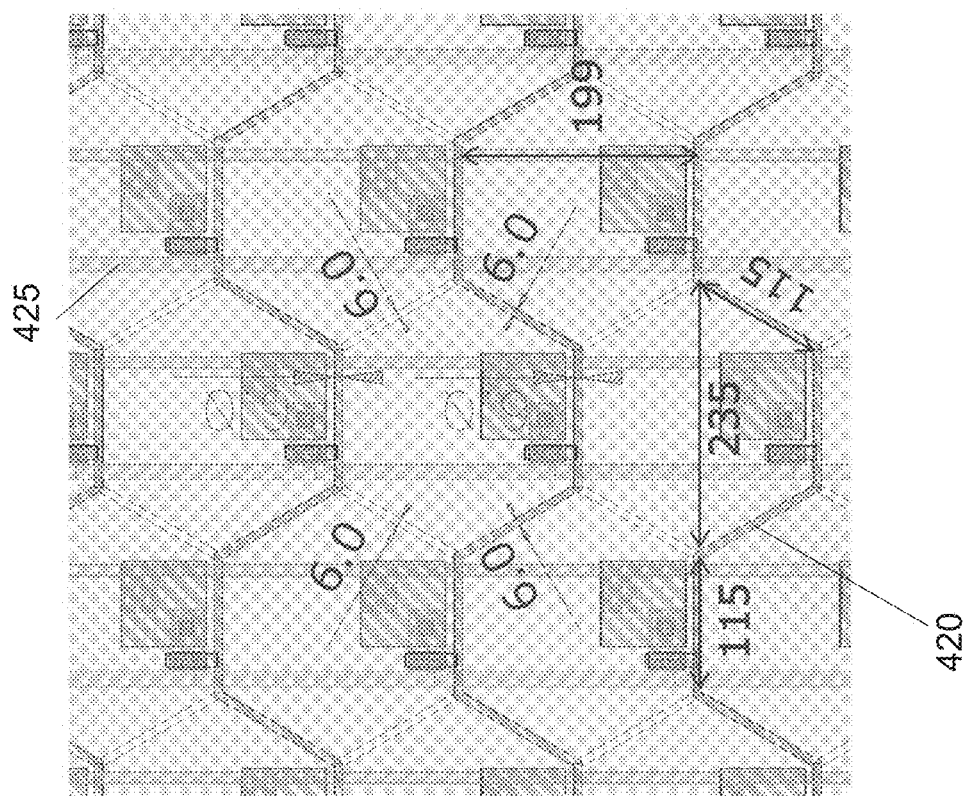
FIGS. 4A and 4B illustrate an embodiment of a backplane using the hexagonal electrode architecture of the invention. The embodiment of FIG. 4A includes 217×164=35,588 pixel electrodes, a gate controller with 825 channels output mode, and a data controller with 800 channels output mode.
Figure 4A:
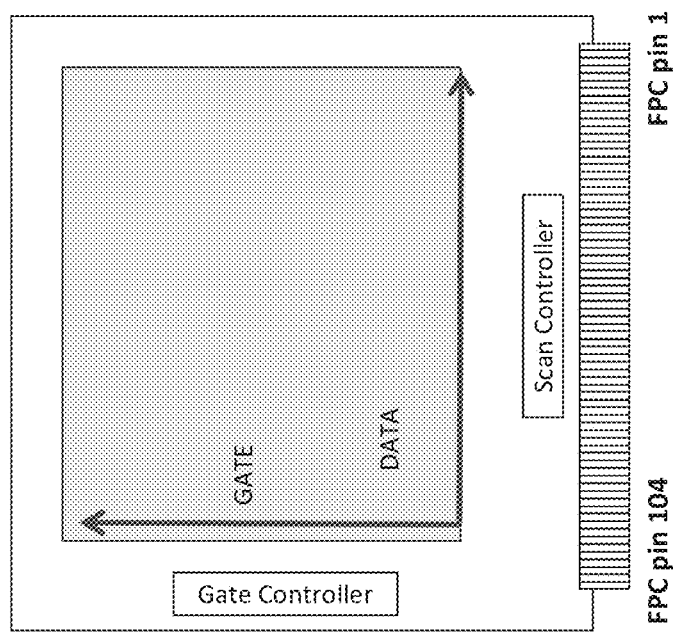

The layout of the controller for the hexagonal array is shown in FIGS. 4A and 4B, including gate and scan controllers. As illustrated in FIG. 4A, more than 30,000 electrodes can be arrayed on a 5 cm×5 cm backplane using commercially available scan and gate controllers. [See for example, scan and gate controllers from MK electric (Taipei, Taiwan).] Using hexagonal electrodes of approximately 235 μm is easily accomplished with a separation between hexagonal electrodes of around 5 μm. Of course, this layout could be made larger or smaller, for example, the backplane could include between 5,000 and 500,000 electrodes. Additionally, the hexagonal electrodes can be larger or smaller, i.e., between 50 μm and 1 mm. The individual TFTs can be controlled with gate lines 420 and scan lines 425 as shown in FIG. 4B.

Figure 5:
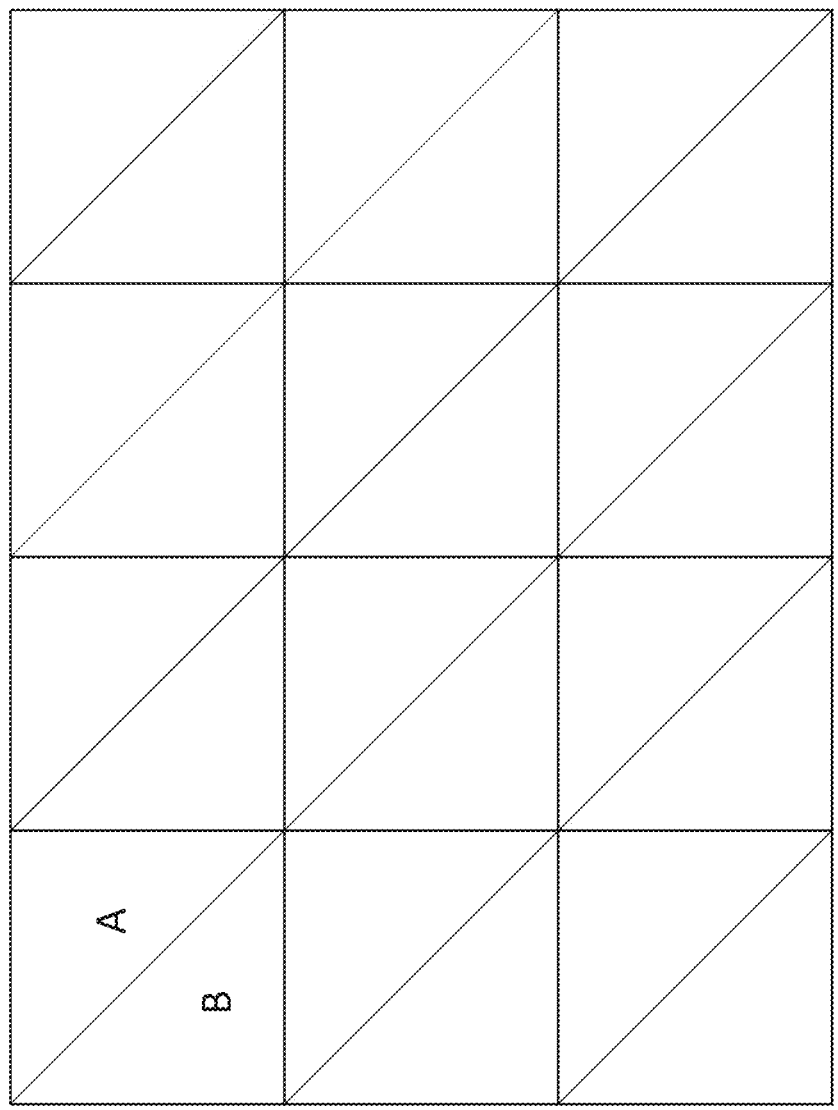
FIG. 5 shows a first embodiment of an array of triangular electrodes where electrodes A and B form a square.
Figure 6:
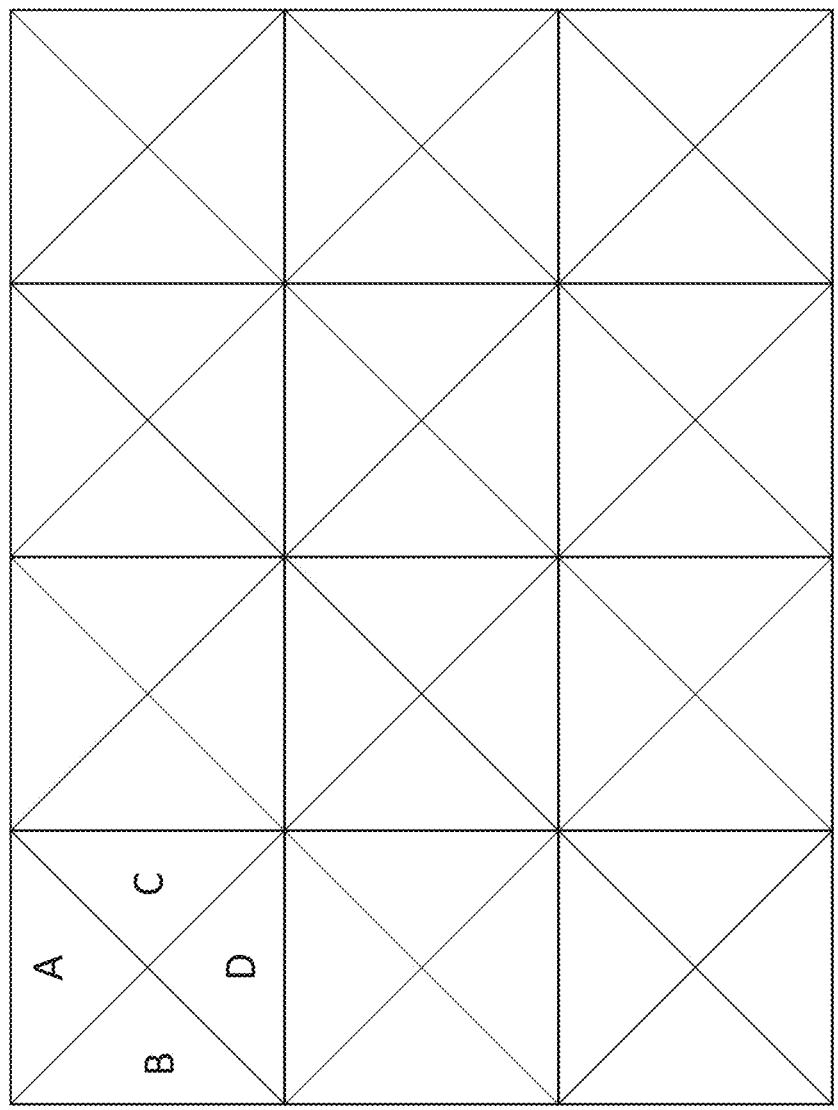
FIG. 6 shows a second embodiment of an array of triangular electrodes where electrodes A, B, C, and D form a square.

FIGS. 5 and 6 illustrate top views of arrays of triangular electrodes. FIG. 5 shows a first embodiment of triangular electrodes where two electrodes "A" and "B" create a square feature. FIG. 6 shows a second embodiment of triangular electrodes where four electrodes "A", "B", "C", and "D" create a square feature. It is possible that other configurations of triangular electrodes may be made that create a square. Like the hexagonal arrays described above, the arrays of FIGS. 5 and 6 can be used in both display and non-display applications.

Figure 7B:
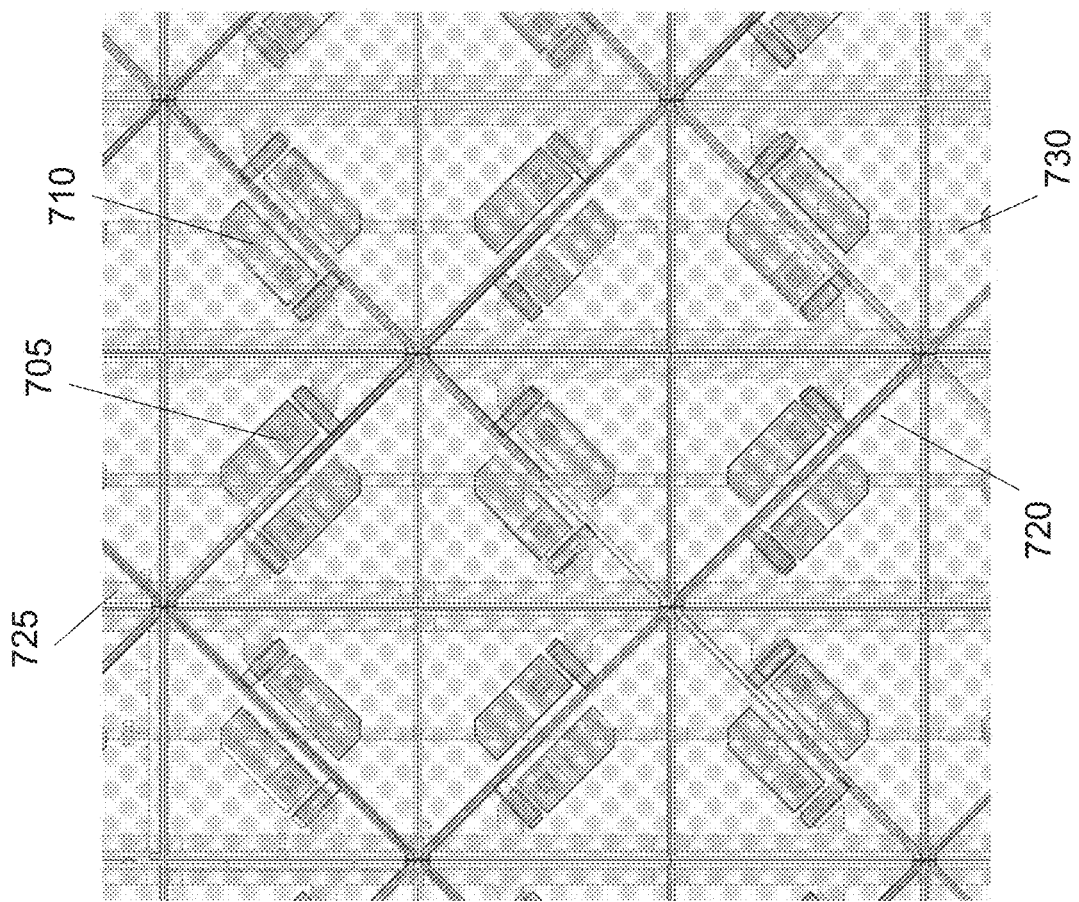
FIGS. 7A and 7B illustrate an embodiment of a backplane using the triangular electrode architecture of the invention. The embodiment of FIG. 7A includes 374×163=60,962 pixel electrodes, a gate controller with 825 channels output mode, and a data controller with 800 channels output mode.
Figure 7A:
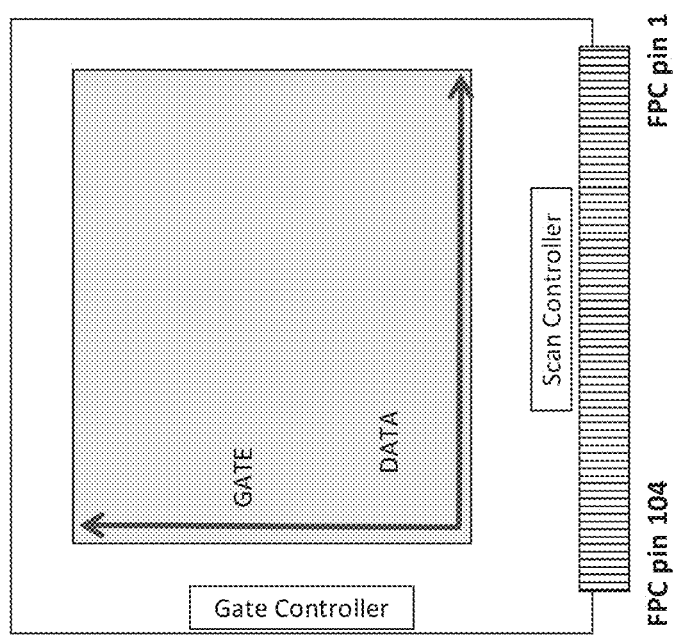

FIGS. 7A and 7B show an overhead view of the driving electronics as arranged for a hexagonal array of the invention. As shown in FIG. 7B, each hexagonal electrode includes a TFT 705 and a storage capacitor 710. Gate lines 720 and scan lines 725, as discussed above control the TFT 705. Notably, in the arrangement of the invention, the gate and scan lines travel parallel to the perimeter of the triangular electrodes. This allows each triangular electrode to be addressed by a gate line and a scan line, as would typically be arranged in a backplane, and controlled by a gate controller and a scan controller. Because the gate and scan lines are running along the perimeter of the electrodes (and not under), the electric field on the electrode is more consistent across the surface of the electrode. This feature is especially useful when the triangular electrodes are larger (i.e., on the order of 500 μm) and field inconsistencies can affect the performance of the device (i.e., stopping a droplet, or showing a wrong color).

Figure 8:
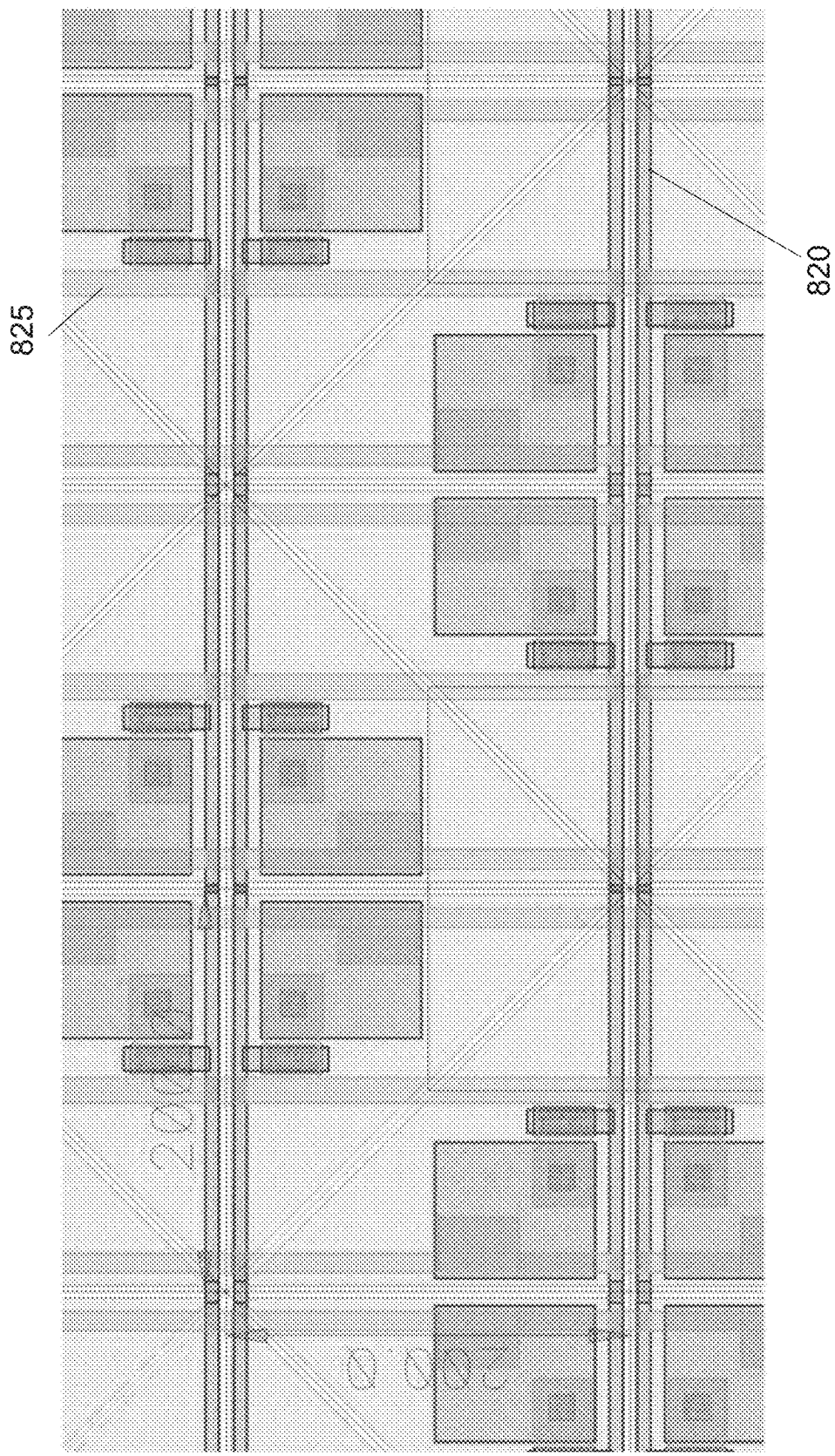
FIG. 8 illustrates an embodiment of a backplane using the triangular electrode architecture of the invention.

The layout of the controller for the triangular array is also shown in FIG. 7A, including gate and scan controllers. As illustrated in FIG. 7A, more than 60,000 electrodes can be arrayed on a 5 cm×5 cm backplane using commercially available scan and gate controllers. Using triangular electrodes of approximately 150 μm is easily accomplished with a separation between triangular electrodes of around 5 μm. Of course, this layout could be made larger or smaller, for example, the backplane could include between 5,000 and 500,000 electrodes. Additionally, the triangular electrodes can be larger or smaller, i.e., between 50 μm and 1 mm. An alternative arrangement of triangular electrodes is shown in FIG. 8, where the gate lines 820 and scan lines 825 are perpendicular.

Of course the arrangements of the electrodes in the figures is exemplary, and the geometrical dimensions of the pixel electrode and/or the gate line and/or scan lines can be modified for special applications or as the number of pixels is limited by available scan controllers or backplane size. For example, the size of the pixel electrode may be reduced to enlarge the gap space between the electrode and the data line. In some other embodiments, the electrical properties of the material between the pixel electrode and the data line may be altered to reduce crosstalk. For example, one may increase the thickness of the insulating thin film between the pixel electrode and its neighboring data lines to reduce capacitive coupling.

Figure 9:
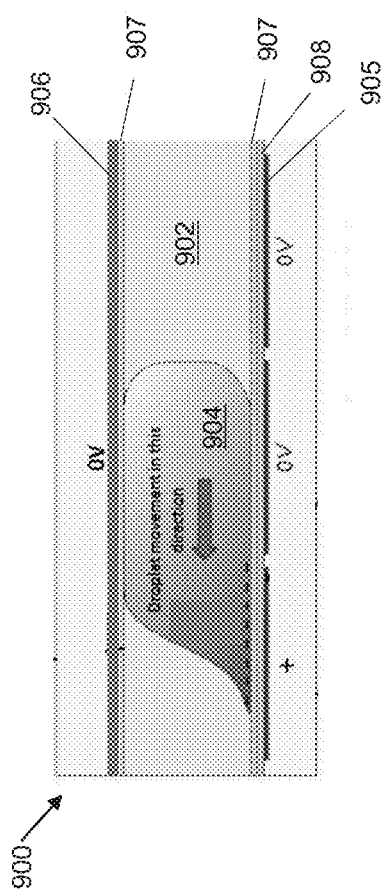
FIG. 9 depicts the movement of an aqueous-phase droplet between adjacent electrodes by providing differing charge states on adjacent electrodes.

In some embodiments, backplanes of the invention can be incorporated into an electrowetting on dielectric (EWoD) device including a backplane of the invention coupled to a light-transmissive electrode and separated by a spacer. The fundamental operation of an EWoD device is illustrated in the sectional image of FIG. 9. The EWoD 900 includes a cell filled with an oil 902 and at least one aqueous droplet 904. The cell gap is defined by a spacer (not shown) but typically, in the range 50 to 200 μm, however the gap can be larger. In a basic configuration, as shown in FIG. 9, a plurality of propulsion electrodes 905 are disposed on one substrate and a singular light-transmissive top electrode 906 is disposed on the opposing surface. The cell additionally includes hydrophobic coatings 907 on the surfaces contacting the oil layer, as well as a dielectric layer 908 between the propulsion electrodes 905 and the hydrophobic coating 907. (The upper substrate may also include a dielectric layer, but it is not shown in FIG. 9). The hydrophobic layer prevents the droplet from wetting the surface. When no voltage differential is applied between adjacent electrodes, the droplet will maintain a spheroidal shape to minimize contact with the hydrophobic surfaces (oil and hydrophobic layer). Because the droplets do not wet the surface, they are less likely to contaminate the surface or interact with other droplets except when that behavior is desired.

The dielectric 908 must be thin enough and have a dielectric constant compatible with low voltage AC driving, such as available from conventional image controllers for LCD displays. For example, the dielectric layer may comprise a layer of approximately 20-40 nm $SiO_2$ topped overcoated with 200-400 nm plasma-deposited silicon nitride. Alternatively, the dielectric may comprise atomic-layer-deposited $Al_2O_3$ between 2 and 100 nm thick, preferably between 20 and 60 nm thick. The TFT is constructed by creating alternating layers of differently-doped a-Si structures along with various electrode lines, with methods know to those of skill in the art. The hydrophobic layer 907 can be constructed from materials such as Teflon® AF (Sigma-Aldrich, Milwaukee, Wis.) and FlurorPel™ coatings from Cytonix (Beltsville, Md.), which can be spin coated over the dielectric layer 908.

While it is possible to have a single layer for both the dielectric and hydrophobic functions, such layers typically require thick inorganic layers (to prevent pinholes) with resulting low dielectric constants, thereby requiring more than 100V for droplet movement. To achieve low voltage actuation, it is better to have a thin inorganic layer for high capacitance and to be pinhole free, topped by a thin organic hydrophobic layer. With this combination, it is possible to have electrowetting operation with voltages in the range +/−10 to +/−50V, which is in the range that can be supplied by conventional TFT arrays.

When a voltage differential is applied between adjacent electrodes, the voltage on one electrode attracts opposite charges in the droplet at the dielectric-to-droplet interface, and the droplet moves toward this electrode, as illustrated in FIG. 2. The voltages needed for acceptable droplet propulsion depend on the properties of the dielectric and hydrophobic layers. AC driving is used to reduce degradation of the droplets, dielectrics, and electrodes by various electro-chemistries. Operational frequencies for EWoD can be in the range 100 Hz to 1 MHz, but lower frequencies of 1 kHz or lower are preferred for use with TFTs that have limited speed of operation.

Figure 10:
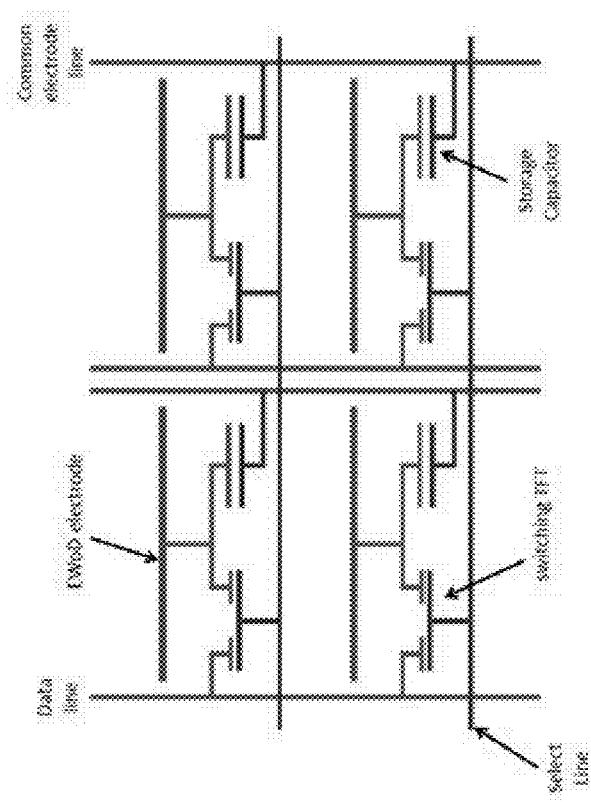
FIG. 10 shows a TFT architecture for a plurality of propulsion electrodes of an EWoD device of the invention.

As shown in FIG. 9, the top electrode 906 is a single conducting layer normally set to zero volts or a common voltage value (VCOM) to take into account offset voltages on the propulsion electrodes 905 due to capacitive kickback from the TFTs that are used to switch the voltage on the electrodes (see FIG. 10). The top electrode can also have a square wave applied to increase the voltage across the liquid. Such an arrangement allows lower propulsion voltages to be used for the TFT connected propulsion electrodes 905 because the top plate voltage 906 is additional to the voltage supplied by the TFT.

As shown in FIG. 10, an active matrix of propulsion electrodes (hexagonal or trigonal or some other shape) can be arranged to be driven with data and gate (select) lines much like an active matrix in a liquid crystal display (LCD). However, unlike an LCD, storage capacitors of the invention typically have a much higher capacitance, as required for electrophoretic displays and electrowetting on dielectric devices. For example, each storage capacitor in an array of backplane electrodes is typically greater than 0.1 pF (pico-Farad), e.g., greater than 0.5 pF, e.g., greater than 1 pF, e.g., greater than 2 pF, e.g., greater than 5 pF, e.g., greater than 10 pF, e.g., greater than 50 pF, e.g., greater than 100 pF.

In EWoD applications, the gate (select) lines are scanned for line-at-a time addressing, while the data lines carry the voltage to be transferred to propulsion electrodes for electrowetting operation. If no movement is needed, or if a droplet is meant to move away from a propulsion electrode, then 0V will be applied to that (non-target) propulsion electrode. If a droplet is meant to move toward a propulsion electrode, an AC voltage will be applied to that (target) propulsion electrode.

Figure 11:
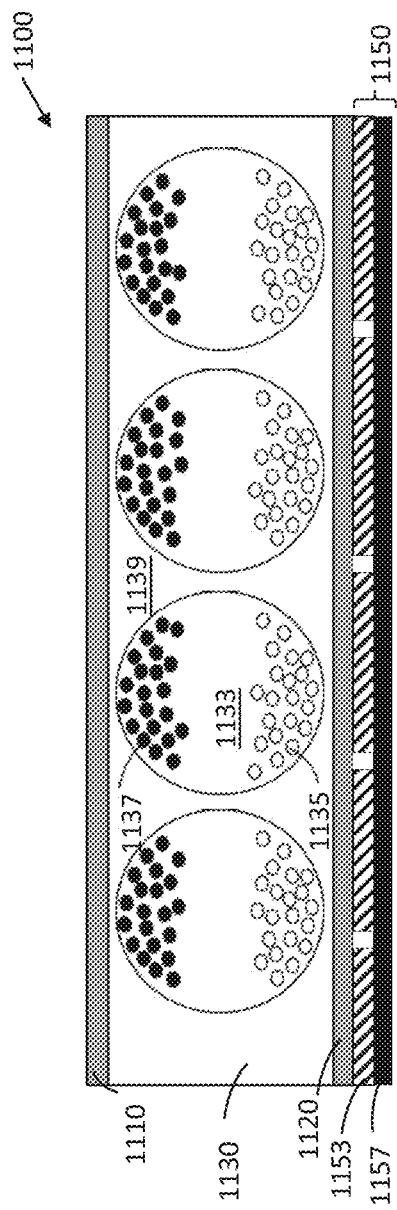
FIG. 11 is a general depiction of an electrophoretic medium, suitable for use with a backplane of the invention.

An exemplary electrophoretic display (EPD) incorporating a pixel electrode backplane of the invention is show in FIG. 11. Display 1100 normally comprises a layer of electrophoretic material 1130 and at least two other layers 1110 and 1120 disposed on opposed sides of the electrophoretic material 1130, at least one of these two layers being a light-transmissive electrode layer, e.g., as depicted by layer 1110 in FIG. 11. The light-transmissive electrode 1110 may be a transparent conductor, such as Indium Tin Oxide (ITO) (which in some cases may be deposited onto a transparent substrate, such as polyethylene terephthalate (PET)). Such EPDs also include, as illustrated in FIG. 11, a backplane 1150, comprising a plurality of driving electrodes 1153 and a substrate layer 1157. The layer of electrophoretic material 1130 may include microcapsules 1133, holding electrophoretic pigment particles 1135 and 1137 and a solvent, with the microcapsules 1133 dispersed in a polymeric binder 1139. Nonetheless, it is understood that the electrophoretic medium (particles 1135 and 1137 and solvent) may be enclosed in microcells (microcups) or distributed in a polymer without a surrounding microcapsule (e.g., PDEPID design described above). Typically, the pigment particles 1137 and 1135 are controlled (displaced) with an electric field produced between the front electrode 1110 and the pixel electrodes 1153. In many conventional EPDs, the electrical driving waveforms are transmitted to the pixel electrodes 1153 via conductive traces (not shown) that are coupled to thin-film transistors (TFTs) that allow the pixel electrodes to be addressed in a row-column addressing scheme. In some embodiments, the front electrode 1110 is merely grounded and the image driven by providing positive and negative potentials to the pixel electrodes 1153, which are individually addressable. In other embodiments, a potential may also be applied to the front electrode 1110 to provide a greater variation in the fields that can be provided between the front electrode and the pixel electrodes 1153.

From the foregoing, it will be seen that the present invention can provide a backplane with arrays of hexagonal or triangular electrodes. It will be apparent to those skilled in the art that numerous changes and modifications can be made to the specific embodiments of the invention described above without departing from the scope of the invention. Accordingly, the whole of the foregoing description is to be interpreted in an illustrative and not in a limitative sense.

The invention claimed is:

1. A microfluidic device comprising:
a pixel electrode backplane defining a plurality of hexagonal cells comprising:
a plurality of scan lines;
a plurality of gate lines;
a plurality of storage capacitors having a capacitance greater than 0.5 pF;
a plurality of thin film transistors; and
a plurality of hexagonal propulsion electrodes having a dielectric coating over the plurality of hexagonal propulsion electrodes and a first hydrophobic layer disposed on the dielectric coating, the hexagonal propulsion electrodes being arranged in a honeycomb structure, and each hexagonal propulsion electrode being operatively coupled to a storage capacitor and a thin film transistor, wherein the voltage potential of each hexagonal propulsion electrode is controllable with only one scan line and only one gate line;
a light-transmissive electrode having a second hydrophobic layer disposed on the light-transmissive electrode;
an oil layer in contact with the first hydrophobic layer and the second hydrophobic layer; and
a spacer disposed between the pixel electrode backplane and the light-transmissive electrode,
wherein the microfluidic device is configured to move aqueous droplets distributed in the oil layer between three or more of the plurality of hexagonal cells.

2. The microfluidic device of claim 1, wherein the plurality of scan lines is coupled to a scan controller, and the plurality of gate lines is coupled to a gate controller.

3. The microfluidic device of claim 2, wherein the pixel electrode backplane is substantially rectangular in shape, and the scan controller is disposed along a first edge of the pixel electrode backplane and the gate controller is disposed along a second edge of the pixel electrode backplane.

4. The microfluidic device of claim 1, wherein the gate lines are routed parallel to the edges of the hexagonal propulsion electrodes.

5. The microfluidic device of claim 4, wherein the scan lines are routed perpendicular to the gate lines.

6. A microfluidic device comprising:
a pixel electrode backplane defining a plurality of triangular cells comprising:
a plurality of scan lines;
a plurality of gate lines;
a plurality of storage capacitors having a capacitance greater than 0.5 pF;
a plurality of thin film transistors; and
a plurality of triangular propulsion electrodes having a dielectric coating over the plurality of triangular propulsion electrodes and a first hydrophobic layer disposed on the dielectric coating, each triangular propulsion electrode being operatively coupled to a storage capacitor and a thin film transistor, wherein four triangular propulsion electrodes are arranged as a square and the voltage potential of each triangular propulsion electrode is controllable with only one scan line and only one gate line;
a light-transmissive electrode having a second hydrophobic layer disposed on the light-transmissive electrode;
an oil layer in contact with the first hydrophobic layer and the second hydrophobic layer; and
a spacer disposed between the pixel electrode backplane and the light-transmissive electrode,
wherein the microfluidic device is configured to move aqueous droplets distributed in the oil layer between three or more of the plurality of triangular cells.

7. The microfluidic device of claim 6 wherein the plurality of scan lines is coupled to a scan controller, and the plurality of gate lines is coupled to a gate controller.

8. The microfluidic device of claim 7, wherein the pixel electrode backplane is substantially rectangular in shape, and the scan controller is disposed along a first edge of the pixel electrode backplane and the gate controller is disposed along a second edge of the pixel electrode backplane.

9. The microfluidic device of claim 6, wherein the gate lines are routed parallel to the edges of the triangular electrodes.

10. The microfluidic device of claim 9, wherein the scan lines are routed perpendicular to the gate lines.

11. The microfluidic device of claim 6, wherein the scan lines are routed parallel to the edges of the triangular propulsion electrodes.

* * * * *